(12) United States Patent
Soldera et al.

(10) Patent No.: US 7,579,898 B2
(45) Date of Patent: Aug. 25, 2009

(54) TEMPERATURE SENSOR DEVICE AND METHODS THEREOF

(75) Inventors: Jefferson Daniel De Barros Soldera, Campinas (BR); Alfredo Olmos, Campinas (BR); Stefano Pietri, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 95 days.

(21) Appl. No.: 11/496,359

(22) Filed: Jul. 31, 2006

(65) Prior Publication Data

US 2008/0061863 A1 Mar. 13, 2008

(51) Int. Cl.
*H01L 35/00* (2006.01)
*H01L 37/00* (2006.01)
*H03K 3/42* (2006.01)
*H03K 17/78* (2006.01)

(52) U.S. Cl. .................................... 327/512; 327/513
(58) Field of Classification Search ................. 327/512, 327/513
See application file for complete search history.

(56) References Cited

U.S. PATENT DOCUMENTS

| | | | | |
|---|---|---|---|---|
| 3,488,529 A | * | 1/1970 | Howe | 327/512 |
| 3,825,778 A | * | 7/1974 | Ahmed | 307/117 |
| 4,845,672 A | * | 7/1989 | Watanabe et al. | 365/190 |
| 5,394,078 A | * | 2/1995 | Brokaw | 323/313 |
| 5,587,649 A | * | 12/1996 | Garrett | 323/369 |
| 5,796,290 A | | 8/1998 | Takahashi | |
| 5,980,106 A | | 11/1999 | Yamamoto et al. | |
| 6,111,456 A | * | 8/2000 | Saito et al. | 327/541 |
| 6,194,920 B1 | * | 2/2001 | Oguri | 327/65 |
| 6,225,851 B1 | * | 5/2001 | Descombes | 327/512 |
| 6,489,831 B1 | * | 12/2002 | Matranga et al. | 327/512 |
| 6,531,911 B1 | * | 3/2003 | Hsu et al. | 327/512 |
| 6,816,351 B1 | | 11/2004 | Frank et al. | |
| 6,847,254 B2 | | 1/2005 | Pai | |
| 6,882,213 B2 | | 4/2005 | Kim | |
| 7,033,072 B2 | * | 4/2006 | Aota et al. | 374/178 |
| 7,084,695 B2 | * | 8/2006 | Porter | 327/512 |
| 7,301,745 B2 | * | 11/2007 | Finney | 361/103 |
| 7,310,013 B2 | * | 12/2007 | Porter | 327/512 |
| 2002/0113622 A1 | * | 8/2002 | Tang | 326/83 |
| 2003/0201816 A1 | | 10/2003 | Dotson | |
| 2004/0239413 A1 | * | 12/2004 | Gubbins | 327/539 |
| 2005/0038625 A1 | | 2/2005 | Ravatin et al. | |
| 2005/0046463 A1 | | 3/2005 | Throngnumchai et al. | |
| 2005/0264971 A1 | | 12/2005 | Morino | |
| 2007/0160114 A1 | * | 7/2007 | Kim | 374/178 |

OTHER PUBLICATIONS

Nagel et al., Integrated 1V Thermal Shutdown Circuit, Electronics Letters, vol. 28, Issue 10, May 1992, pp. 969-970.

* cited by examiner

*Primary Examiner*—Lincoln Donovan
*Assistant Examiner*—Adam D Houston

(57) ABSTRACT

A device having a temperature sensor device is disclosed. The temperature sensor device includes a complementary to absolute temperature (CTAT) module and a reference module. Both the temperature sensor and the reference voltage module provide signals, that vary in a complementary relationship with the variation in temperature. While the signals can be voltages or currents, for purposes of discussion the signals are discussed in terms of voltages herein. The reference module provides a signal that has a relatively small variation with temperature as compared to the variation in a signal provided by the CTAT module. The signals are provided to a comparator, which provides a temperature control signal based on a comparison of the input signals.

20 Claims, 4 Drawing Sheets

US 7,579,898 B2

TEMPERATURE SENSOR DEVICE AND METHODS THEREOF

FIELD OF THE DISCLOSURE

The present disclosure relates to integrated circuit devices and more particularly to temperature sensors for integrated circuit devices.

BACKGROUND

Thermal monitoring often is implemented in integrated circuit devices to reduce device damage or performance problems due to overheating. Temperature sensor devices, can be employed to detect the temperature of the integrated circuit device. However, conventional temperature sensors can require an undesirable amount of power to operate, particularly for integrated circuit devices that include low-power modes.

Accordingly, it will be appreciated than an improved temperature sensor device would be advantageous.

DETAILED DESCRIPTION

A device having a temperature sensor device is disclosed. The temperature sensor device includes a complementary to absolute temperature (CTAT) module and a reference module. Both the temperature sensor and the reference voltage module provide signals, that vary in a complementary relationship with the variation in temperature. While the signals can be voltages or currents, for purposes of discussion the signals are discussed in terms of voltages herein. The reference module provides a signal that has a relatively small variation with temperature as compared to the variation in a signal provided by the CTAT module. The signals are provided to a comparator, which provides a temperature control signal based on a comparison of the input signals. Because of the complementary relationship between the signals and the temperature level, the temperature sensor device dissipates a relatively small amount of power and can be implemented in a small area of the integrated circuit.

Figure 1:
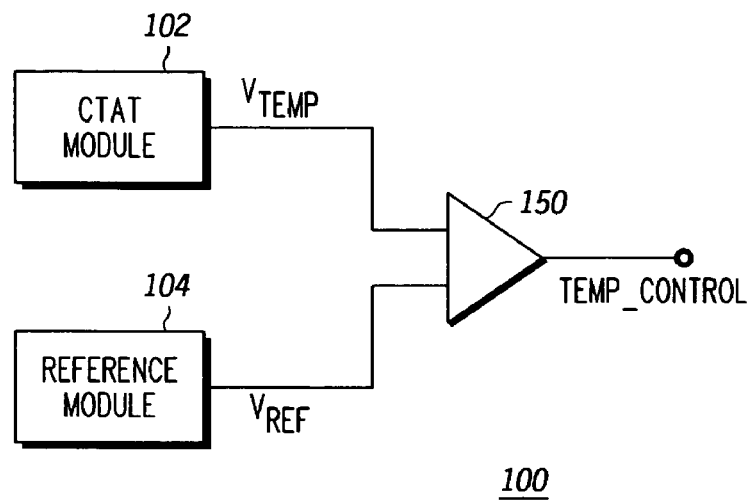
FIG. 1 is a block diagram of a particular embodiment of a temperature sensor device.

Referring to FIG. 1, a block diagram of a temperature sensor device 100 is illustrated. Devices forming the temperature sensor device 100 include a CTAT module 102, a reference module 104, and a comparator 150. The CTAT module 102 includes an output to provide a voltage VTEMP that varies inversely with temperature to an input of the comparator 150. Similarly the reference module 104 includes an output to provide a voltage VREF that varies inversely with temperature to an input of the comparator 150, though VREF varies at a slower rate than VTEMP. It will be appreciated that although the signal VREF is not constant with respect to temperature, because VREF varies at a slower rate with respect to temperature than VTEMP, it is considered a temperature reference relative to VTEMP. The comparator 150 includes an output to provide an output signal TEMP_CONTROL that switches at a specific temperature.

During operation, the voltage VTEMP is generated based on a temperature level detected at the CTAT module 102. In a particular embodiment, the level of the voltage VTEMP is based on the voltage difference between the base and emitter of a bipolar junction transistor. Because the base-emitter voltage level will vary with temperature at the transistor, the voltage VTEMP will reflect a temperature level at the CTAT module 102. In a particular embodiment, the voltage VTEMP is a complementary-to-absolute-temperature (CTAT) voltage.

The voltage VREF varies based a temperature detected at the reference module 104, but at a smaller rate with respect to temperature than the variation of voltage VTEMP. Accordingly, the voltage VREF provides a relatively stable reference voltage compared to the voltage VTEMP. In a particular embodiment, the voltage VREF is a CTAT voltage.

The voltages VREF and VTEMP are compared at the comparator 150 to generate a logic signal TEMP_CONTROL. Accordingly, the signal TEMP_CONTROL provides an indication of whether the temperature detected at the CTAT module 102 is above or below the temperature threshold associated with the voltage VREF.

Figure 2:
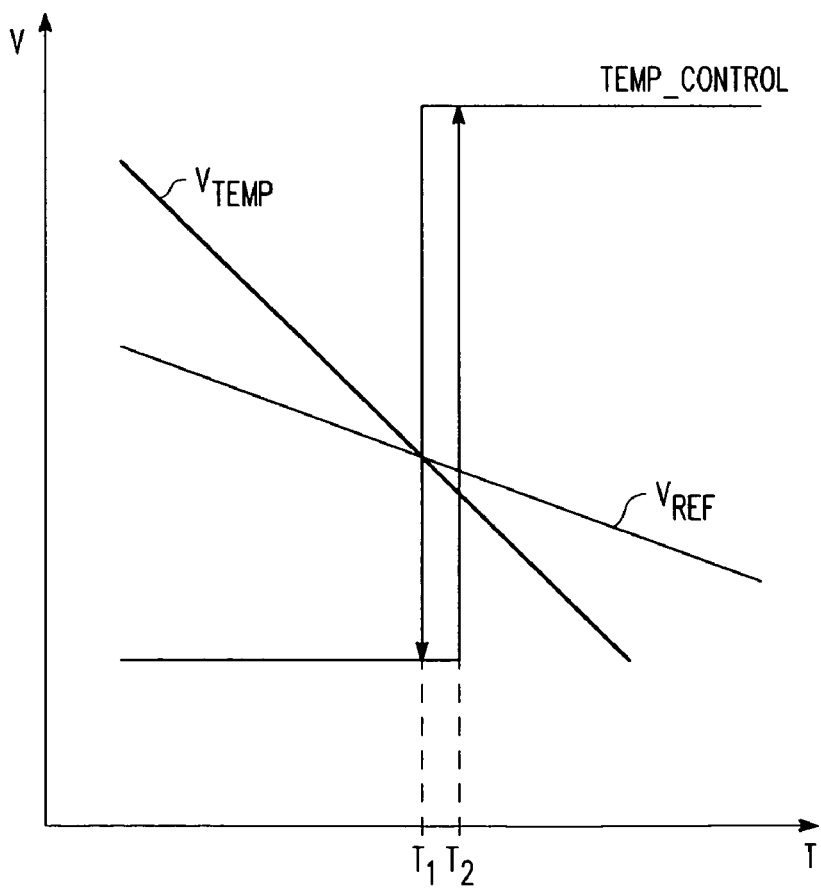
FIG. 2 is a graph diagram of a particular embodiment of the relationship between temperature and the output signals of a temperature sensor device.

The relationship between the voltages VREF and VTEMP and the signal TEMP_CONTROL can be better understood with reference to FIG. 2. FIG. 2 illustrates a diagram 200 of a particular embodiment of this relationship. As illustrated, the X-axis of the diagram 200 represents a temperature level of the device 100 while the Y-axis represents voltage. As shown, the voltages VREF and VTEMP vary in a complementary (inverse) relationship to the temperature. Further, as illustrated, the magnitude of the slope of the VTEMP voltage curve is larger than the magnitude of the slope of the VREF voltage curve. Accordingly, the voltage VREF is relatively stable with respect to temperature compared to the voltage VTEMP. In a particular embodiment, the slope of the VTEMP voltage curve is approximately −4.4 mV/° C. while the slope of the VREF voltage curve is −1.5 mV/° C. Thus, the voltage VREF represents a temperature reference with respect to the voltage VTEMP, which represents a detected temperature level.

As illustrated, the signal TEMP_CONTROL is set to a first logic state, such as to a LOW logic level, when the detected temperature level is less than the temperature threshold T1. When the temperature is above the temperature T2, the signal TEMP_CONTROL is set to a second logic state, such as a HIGH logic level.

Hysteresis in the comparator 150 can be used to ensure stability in the signal TEMP_CONTROL. Accordingly, as temperature rises the comparator output will not switch until the temperature reaches $T_2$, while as the temperature falls the comparator output will not switch until the temperature reaches $T_1$.

Figure 3:
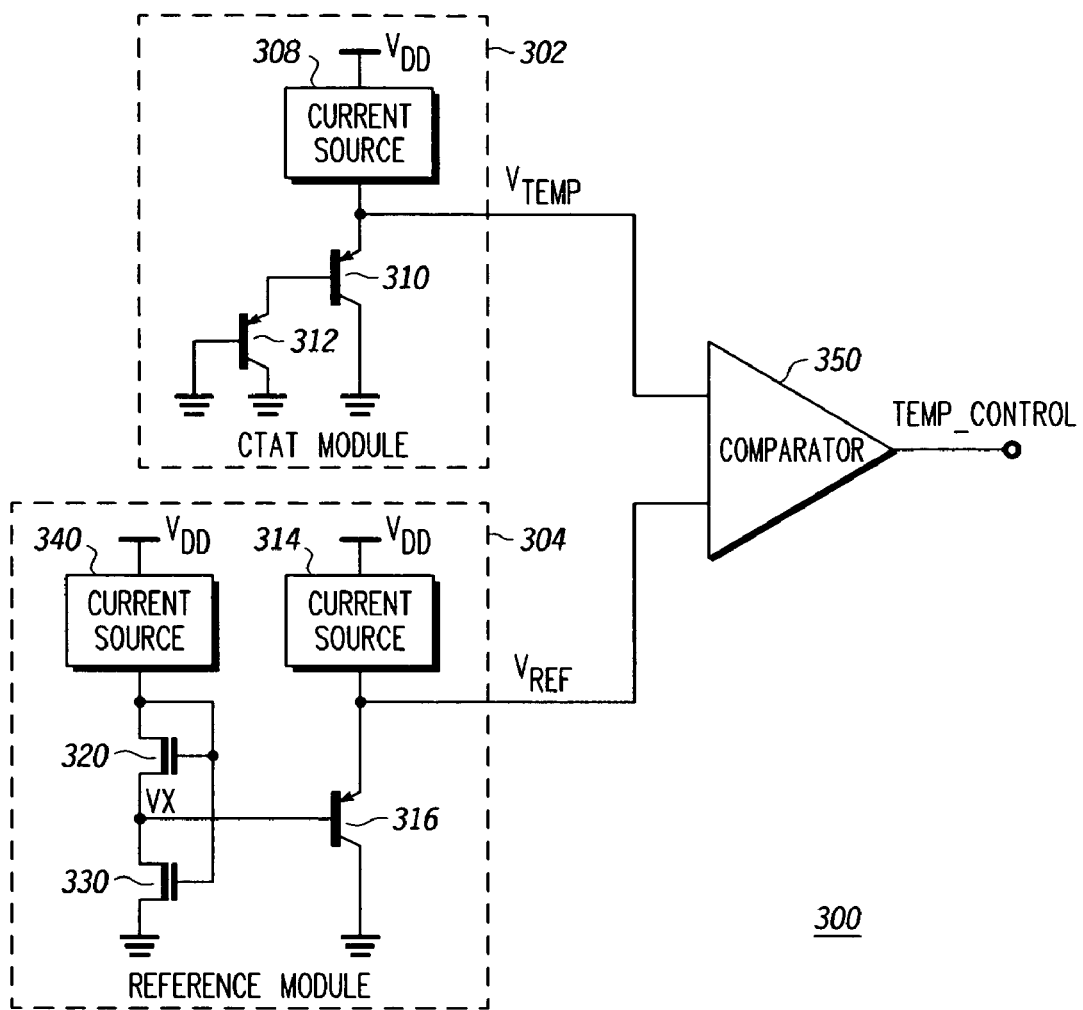
FIG. 3 is a combination circuit and block diagram of a particular embodiment of a temperature sensor and a reference voltage module of a temperature sensor device.

Referring to FIG. 3, a block diagram of a temperature sensor device 300 is illustrated that represents a particular embodiment of the temperature sensor device 100 of FIG. 1. Devices forming the temperature sensor device 300 include a CTAT module 302, a reference voltage module 304, and a comparator 350. The CTAT module 302 includes an output to provide a voltage VTEMP to an input of the comparator 350, while the reference voltage module 304 includes an output to provide a voltage VREF to an input of the comparator 350. The comparator 350 includes an output to provide an output signal TEMP_CONTROL.

During operation, the temperature sensor device 300 operates as described above with reference to the temperature sensor device 100 of FIG. 1. Accordingly, the voltage VTEMP represents a temperature level detected at the CTAT module 302 and the voltage VREF represents a temperature level detected at the reference module 304 that represents a threshold level relative to the voltage VTEMP. The signal TEMP_CONTROL provides an indication of a temperature by indicating when the detected temperature exceeds the temperature threshold.

The CTAT module 302 includes a current source 308 and bipolar junction transistors 310 and 312. The transistor 310 includes an emitter current electrode to provide the voltage VTEMP, a collector current electrode connected to a ground reference voltage, and a base control electrode. The transistor 312 includes an emitter current electrode connected to the control electrode of the transistor 310, a collector current electrode connected to the ground reference voltage and a base control electrode connected to the ground reference voltage. The current source 308 includes an input connected to a reference voltage VDD and an output connected to the first current electrode of the transistor 310.

During operation, the voltage between the base and the emitter of the transistor 312 will vary based on the temperature at the CTAT module 302. In a particular embodiment, the base-emitter voltage of the transistor 312 is a CTAT voltage. The transistor 310 performs as a level shifter for the voltage at the emitter of the transistor 312 so that the voltage VTEMP varies at a desired rate with respect to temperature. In the illustrated embodiment, the voltage VTEMP can be expressed as follows:

$$VTEMP = V_{eb310} + V_{eb312}$$

where $V_{eb310}$ is the emitter-base voltage for the transistor 310 and $V_{eb312}$ is the emitter-base voltage for the transistor 312. In a particular embodiment, the transistor 310 and the transistor 312 are closely matched, so the voltage VTEMP can be expressed as $$VTEMP = 2V_{eb310}.$$

The reference voltage module 304 includes a bipolar junction transistor 316, n-type field effect transistors 320 and 330, and current sources 314 and 340. The transistor 316 includes an emitter current electrode to provide the voltage VREF, a collector current electrode connected to the ground voltage reference and a base control electrode to receive a voltage $V_x$. The transistor 320 includes a first current electrode, a second current electrode connected to the control electrode of the transistor 316, and a control electrode connected to its first current electrode. The transistor 330 includes a first current electrode connected to the control electrode of the transistor 316 to provide the voltage $V_x$, a second current electrode connected to the ground reference voltage, and a control electrode connected to the control electrode of the transistor 320. The current source 314 includes an input connected to the voltage reference VDD and an output connected to the first current electrode of the transistor 316. The current source 340 includes an input connected to the voltage reference VDD and an output connected to the first current electrode of the transistor 320.

During operation, the voltage VREF depends on the emitter-base voltage of the transistor 316 and the voltage $V_x$. Accordingly, the level of the voltage VREF can be expressed as follows:

$$VREF = V_{eb316} + V_x$$

where $V_{eb316}$ is the emitter-base voltage of the transistor 316. In a particular embodiment, both $V_{eb316}$ and $V_x$ vary with temperature, with $V_{eb316}$ being a CTAT voltage and $V_x$ being a proportional to absolute temperature (PTAT) voltage. That is, the voltage $V_{eb316}$ varies inversely with temperature, whereas as temperature increases, $V_x$ also increases. As a result, the voltage VREF is a CTAT signal that varies at a rate less than VTEMP.

The CTAT module 302 and the reference voltage module 304 dissipate low power compared to conventional devices that employ more stable reference voltages that result in greater temperature differences during operation. In addition, the illustrated embodiments can be implemented to occupy a relatively small area of an integrated circuit as compared to embodiments using more stable references.

Figure 4:
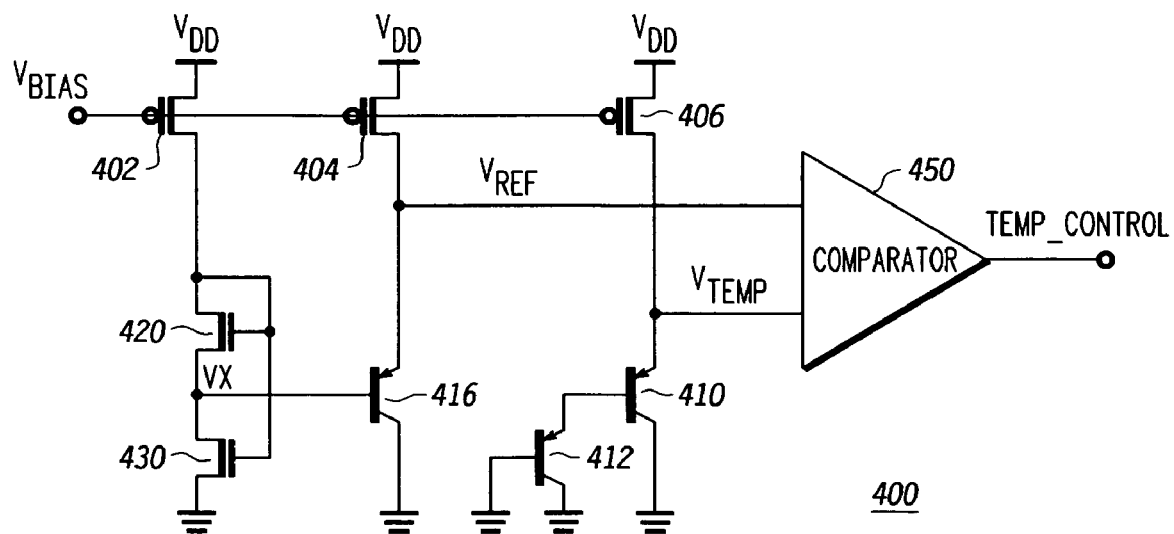
FIG. 4 is a circuit diagram of a particular embodiment of a temperature sensor device.

Referring to FIG. 4, a particular embodiment of a temperature sensor device 400 is illustrated that represents a particular embodiment of the temperature sensor device 100 of FIG. 1. The temperature sensor device 400 includes bipolar junction transistors 410, 412, and 416. The temperature sensor device also includes p-type field effect transistors 402, 404, and 406, and n-type field effect transistors 420, and 430. In addition, the temperature sensor device 400 includes a comparator 450.

The transistor 402 includes a first current electrode connected to a first voltage reference (VDD), a second current electrode, and a control electrode to receive a voltage VBIAS. In a particular embodiment, the voltage VBIAS is provided by a current source module. The transistor 420 includes a first current electrode connected to the second current electrode of the transistor 402, a second current electrode to provide a voltage $V_x$, and a control electrode connected to the first current electrode of the transistor 420. The transistor 430 includes a first current electrode connected to the second current electrode of the transistor 420, a second current electrode connected to a ground voltage reference, and a control electrode connected to the control electrode of the transistor 420.

The transistor 404 includes a first current electrode connected to the voltage reference VDD, a second current electrode, and a control electrode to receive the voltage VBIAS. The transistor 416 includes an emitter current electrode connected to the second current electrode of the transistor 404, a collector current electrode connected to the ground voltage reference, and a base control electrode connected to the second current electrode of the transistor 420. The emitter current electrode of the transistor 416 provides a voltage VREF.

The transistor 406 includes a first current electrode connected to the voltage reference VDD, a second current electrode, and a control electrode to receive the voltage VBIAS. The transistor 410 includes an emitter current electrode connected to the second current electrode of the transistor 406, a collector current electrode connected to the ground voltage reference, and a base control electrode. The emittter current electrode of the transistor 410 provides a voltage VTEMP. The transistor 412 includes an emitter current electrode connected the control electrode of the transistor 410, a collector current electrode connected to the ground voltage reference, and a base electrode connected to the ground voltage reference.

The comparator 450 includes a first input connected to the first current electrode of the transistor 410 and a second input connected to the first current electrode of the transistor 416. The comparator 450 also includes an output to provide a logic signal TEMP_CONTROL.

During operation, the comparator 450 compares the voltage VTEMP to the voltage VREF and sets the level of the signal TEMP_CONTROL based on the comparison. Accordingly, the state of the signal TEMP_CONTROL depends on whether the temperature indicated by the voltage VTEMP has exceeded the reference temperature indicated by the voltage VREF.

The voltage VTEMP is based on the emitter-base voltages of the transistor 410 and the transistor 412. Accordingly, the transistor 410 acts as a level shifter for the emitter-base voltage of the transistor 412. The emitter-base voltages of the transistor 410 and the transistor 412 vary based on the temperature of the device 400, so the voltage VTEMP is based on this temperature. In a particular embodiment, the voltage VTEMP is a CTAT voltage.

The voltage VREF is based on the emitter-base voltage of the transistor 416 and the voltage $V_x$. Accordingly, the voltage VREF may be expressed according to the following equation:

$$VREF = V_x + V_{eb416}$$

where $V_{eb416}$ is the emitter-base voltage of the transistor 416. Thus, in the illustrated embodiment. The voltage $V_x$ can be expressed according to the following formula:

$$V_x = \left(\frac{n}{n+1}\right)\left(\frac{kT}{q}\right)\left[\left(\sqrt{1+i_{f430}} - \sqrt{1+i_{f420}} + \ln\left(\frac{\sqrt{1+i_{f430}}-1}{\sqrt{1+i_{f420}}-1}\right)\right)\right]$$

where n is the slope factor based on the transfer characteristic of the transistor 430 and the transistor 420, and will depend on the process technology used to form the transistors. In addition, k is Boltzmann's constant, T is the absolute temperature in degrees Kelvin, q is the electron charge, $i_{f420}$ is the inversion factor of the transistor 420 and $i_{f430}$ is the inversion factor of the transistor 430. In a particular embodiment, the inversion factors $i_{f420}$ and $i_{f430}$ are strong inversion factors.

Accordingly, as shown by the formula, $V_x$ is a PTAT voltage. $V_x$ is shifted by the CTAT emitter base voltage of the transistor 416, resulting in VREF being a CTAT voltage.

Figure 5:
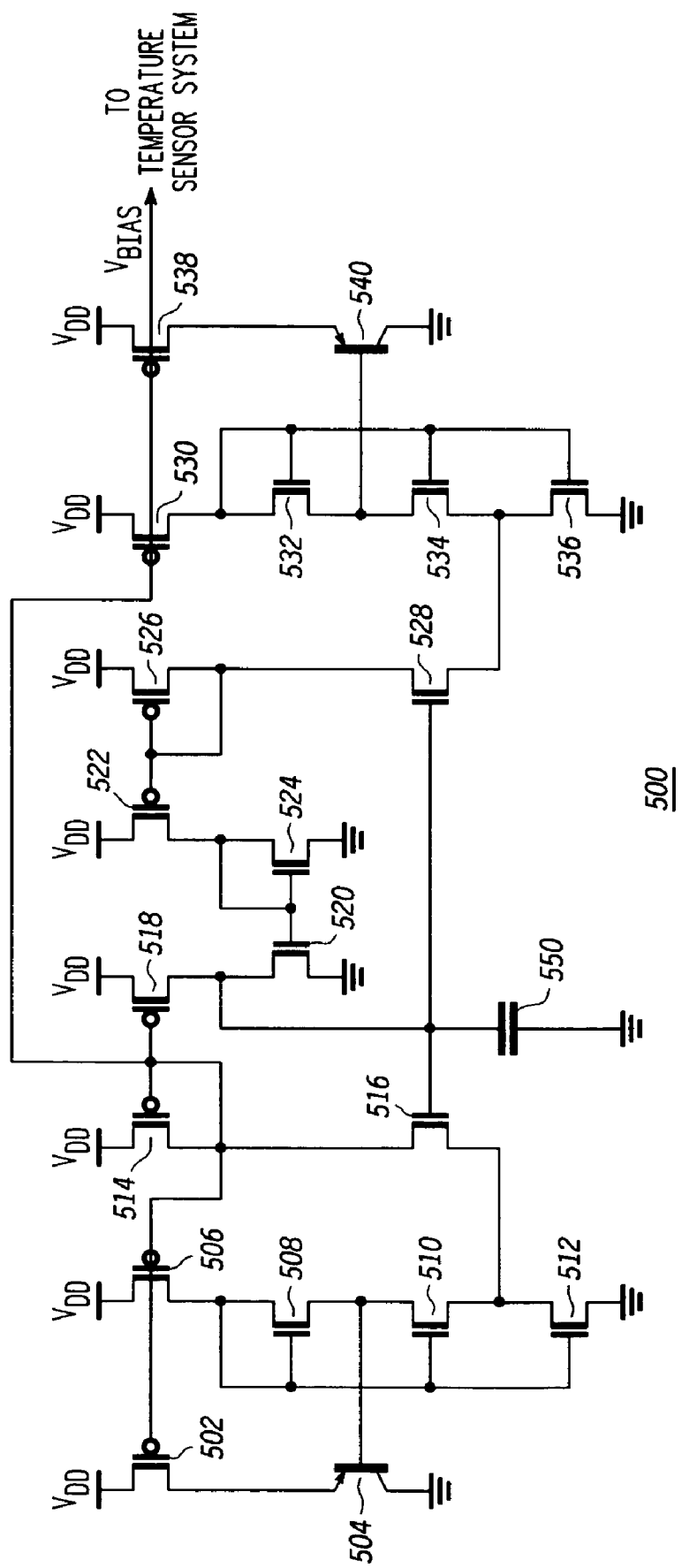
FIG. 5 is a circuit diagram of a particular embodiment of a current source for a temperature sensor device.

Referring to FIG. 5, a particular embodiment of a current source module 500 is illustrated that can provide the bias signal VBIAS to the temperature sensor device 400 of FIG. 4.

The current source module 500 includes p-type field effect transistors 502, 506, 514, 518, 522, 526, 530, and 538, and n-type field effect transistors 508, 510, 512, 516, 520, 524, 528, 532, 534, and 536. The current source module also includes bipolar junction transistors 504 and 540 and capacitor 550. The transistor 502 includes a first current electrode connected to a voltage reference VDD, a second current electrode, and a gate electrode. The transistor 504 includes an emitter current electrode connected to the second current electrode of the transistor 502, a collector current electrode connected to a ground voltage reference, and a base control electrode.

The transistor 506 includes a first current electrode connected to a voltage reference VDD, a second current electrode, and a gate electrode connected to the gate electrode of the transistor 502. The transistor 508 includes a first current electrode connected to the second current electrode of the transistor 506, a second current electrode connected to the base electrode of the transistor 504, and a gate electrode connected to its first current electrode. The transistor 510 includes a first current electrode connected to the second current electrode of the transistor 508, a second current electrode, and a gate electrode connected to the first current electrode of the transistor 508. The transistor 512 includes a first current electrode connected to the second current electrode of the transistor 510, a second current electrode connected to the ground voltage reference, and a gate electrode connected to the first current electrode of the transistor 508.

The transistor 514 includes a first current electrode connected to a voltage reference VDD, a second current electrode connected to the gate electrode of the transistor 506, and a gate electrode connected to the second current electrode of the transistor 514. The transistor 516 includes a first current electrode connected to the second current electrode of the transistor 514, a second current electrode connected to the first current electrode of the transistor 512, and a gate electrode.

The transistor 518 includes a first current electrode connected to a voltage reference VDD, a second current electrode connected to the gate electrode of the transistor 516, and a gate electrode connected to the gate electrode of the transistor 514. The transistor 520 includes a first current electrode connected to the second current electrode of the transistor 514, a second current electrode connected to the second voltage reference, and a gate electrode.

The transistor 522 includes a first current electrode connected to a voltage reference VDD, a second current electrode, and a gate electrode. The transistor 524 includes a first current electrode connected to the second current electrode of the transistor 522, a second current electrode connected to the second voltage reference, and a gate electrode connected to the gate electrode of the transistor 520, and connected to its first current electrode.

The transistor 526 includes a first current electrode connected to a voltage reference VDD, a gate electrode connected to the gate electrode of the transistor 522 and a second current electrode connected to the gate electrode of the transistor 526. The transistor 528 includes a first current electrode connected to the second current electrode of the transistor 526, a second current electrode, and a gate electrode connected to the gate electrode of the transistor 516.

The transistor 530 includes a first current electrode connected to a voltage reference VDD, a second current electrode, and a gate electrode connected to the gate electrode of the transistor 514. The transistor 532 includes a first current electrode connected to the second current electrode of the transistor 530, a second current electrode, and a gate electrode connected to the first current electrode of the transistor 532. The transistor 534 includes a first current electrode connected to the second current electrode of the transistor 532, a second current electrode connected to the second current electrode of the transistor 528, and a gate electrode connected to the gate electrode of the transistor 532. The transistor 536 includes a first current electrode connected to the second current electrode of the transistor 534, a second current electrode connected to the ground voltage reference, and a gate electrode connected to the first current electrode of the transistor 532.

The transistor 538 includes a first current electrode connected to a voltage reference VDD, a second current electrode, and a gate electrode connected to the gate electrode of the transistor 514. The transistor 540 includes an emitter current electrode connected to the second current electrode of the transistor 538, a collector current electrode connected to the ground voltage reference, and a base control electrode connected to the first current electrode of the transistor 534.

The capacitor 550 includes a first electrode connected to the gate electrode of the transistor 516 and a second electrode connected to the ground voltage reference.

During operation, the current source 500 module provides the voltage VBIAS to the temperature sensor device 400. The voltage VBIAS is provided via the first current electrode of the transistor 516. The voltage VBIAS may be applied by the temperature sensor device 500 to the current mirrors formed by the transistors 402, 404, and 406 are current sources that supply the same current applied to the gate electrodes of the transistor 530 and the transistor 538.

The current source module 500 provides a stable current that varies minimally with respect to temperature. In addition, the current source module 500 is a low power current source compared to conventional current sources, such as those that employ a bandgap current source.

Figure 6:
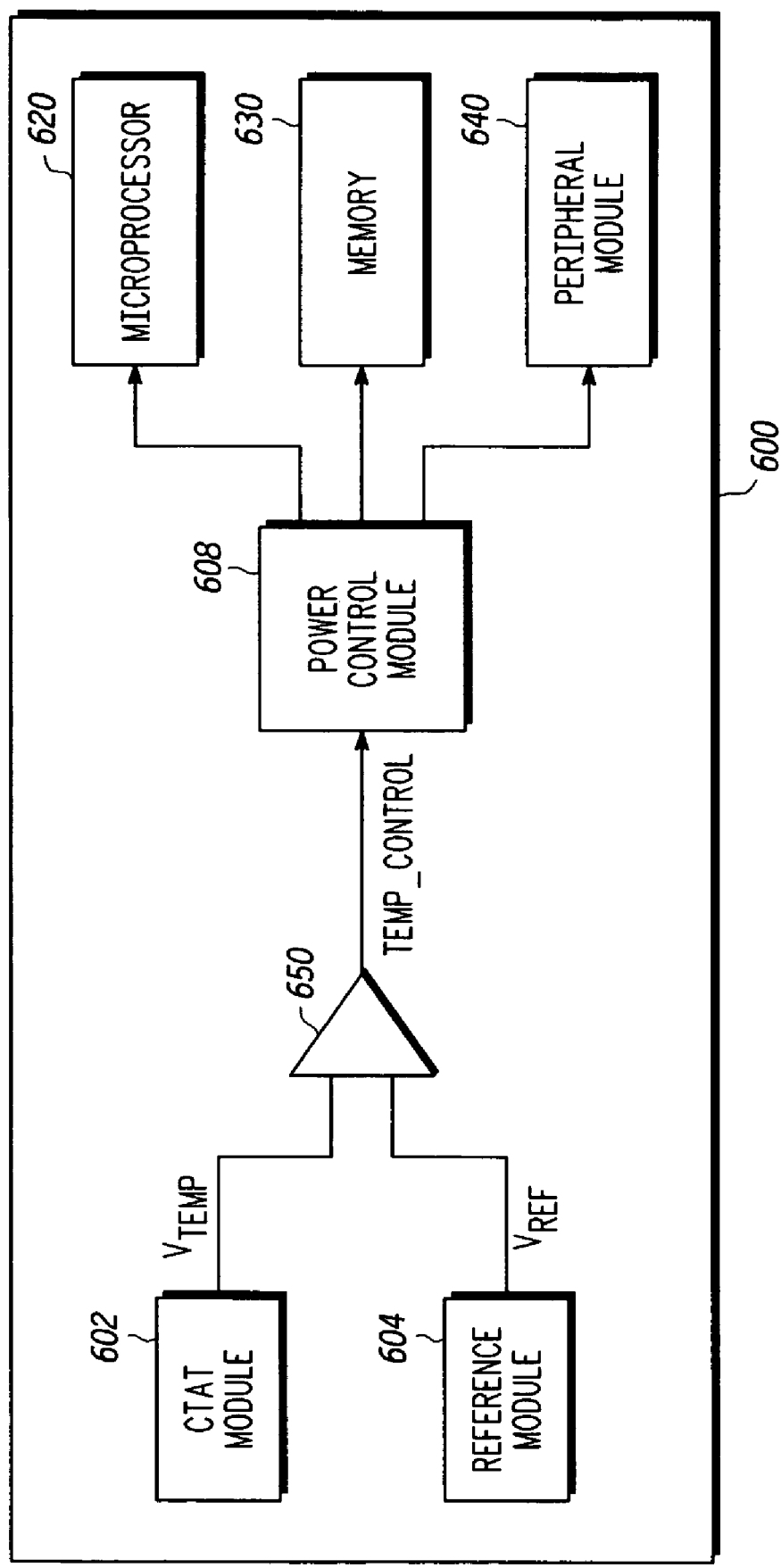
FIG. 6 is a block diagram of a particular embodiment of an integrated circuit device a power control device using a temperature sensor device.

Referring to FIG. 6, a particular embodiment of an integrated circuit device 600 employing a temperature sensor device is illustrated. In a particular embodiment, the integrated circuit device 600 is a tire pressure sensor device located in an automobile tire. The integrated circuit device 600 includes a CTAT module 602, a reference module 604, a comparator 650, a power control module 608, a microprocessor 620, a memory 630, and a peripheral module 640. The CTAT module 602 includes an output to provide a voltage VTEMP to an input of the comparator 650, while the reference module 604 includes an output to provide a voltage VREF to an input of the comparator 650. The comparator 650 includes an output to provide an output signal TEMP_CONTROL to an input of the power control module 608. The power control module 608 includes a number of outputs to provide a control signals to the microprocessor 620, the memory 630, and the peripheral module 640. The microprocessor 620 can be a processor, a CPU, and the like. The memory 630 can be a RAM module, a non-volatile memory, and the like. The peripheral module 640 can be a communication interface module, a bus controller, a device control module, or other module peripheral to the microprocessor 640.

During operation, the CTAT module 602, the reference module 604, and the comparator 650 operate in similar fashion to the temperature sensor device 100 of FIG. 1. Accordingly, the TEMP_CONTROL signal provides an indication of whether the temperature detected at the CTAT module 602 has exceed the threshold temperature associated with the voltage VREF.

The power control module 608 controls a power mode of the integrated circuit device 600 depending on the state of the TEMP_CONTROL signal. The power control module 608 can be configured in a variety of ways. In a particular embodiment, the power control module 608 can change a power mode of the integrated circuit device 600 to a low-power mode in response to assertion of the TEMP_CONTROL signal, indicating an undesirably high temperature of the integrated circuit device 600. In another particular embodiment, the power control module 608 can change a power mode of the integrated circuit 600 to a normal-power mode in response to negation of the TEMP_CONTROL signal, indicating that the temperature of the integrated circuit device 600 within design parameters.

In the different power modes, the control module 608 applies control signals to the microprocessor 620, the memory 630, and the peripheral control module 640 to control power modes for each module. For example, in response to assertion of the TEMP_CONTROL signal, the power control module 608 can apply control signals to place the microprocessor 620, the memory 630, and the peripheral module 640 in a low-power mode. In addition, the power modes of each module can be controlled independently. For example, in response to negation of the TEMP_CONTROL signal, the power control module 608 can apply control signals to place the microprocessor 620 in a normal power mode, but apply control signals to leave the peripheral module 640 in a low-power mode.

Further, the power control module 608 can control the power mode of the integrated circuit device in a number of ways. In a particular embodiment, the power control module 608 controls which of a plurality of voltage domains is applied to the integrated circuit device 600. In another particular embodiment, the power control module 600 can gate a clock of the integrated circuit device 600 to control the power mode. By controlling the power mode of the integrated circuit device 600 based on the detected temperature, the power control module 608 can improve the performance of the integrated circuit device 600 and reduce the likelihood that the device will be damaged by excessive temperature conditions.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure. For example, it will be appreciated that the reference signal and temperature signal could be provided to an amplifier that would provide a linear or other analog response depending on the difference between the signals, thereby providing an indication of a measured temperature. It will also be appreciated that different kinds of transistors may be employed or biased diodes can be employed in place of some of the resistors. It will further be appreciated that, although some circuit elements are depicted as connected to other circuit elements, the illustrated elements may also be coupled via additional circuit elements, such as resistors, capacitors, transistors, and the like.

What is claimed is:

1. A device, comprising:
    a first transistor comprising a control electrode coupled to a first voltage reference, a first current electrode to provide a CTAT signal relative a voltage at the control electrode, and a second current electrode coupled to the first voltage reference;
    a second transistor comprising a control electrode coupled to a second voltage reference, a first current electrode to provide a PTAT signal, and a second current electrode coupled to the first voltage reference;
    a comparator comprising a first input coupled to the first current electrode of the first transistor, a second input coupled to the first current electrode of the second transistor, and an output; and
    a first level shifter coupled between the first transistor and the first input of the comparator.

2. The device of claim 1, wherein the first transistor is a bipolar junction transistor and the second transistor is a field effect transistor.

3. The device of claim 1, further comprising:
    a power control module comprising an input coupled to the output of the comparator, wherein the power control module is configured to change a first power mode of a first module of an integrated circuit device based on a signal provided by the comparator while maintaining a power mode of a second module of the integrated circuit device.

4. The device of claim 1, wherein the first level shifter comprises a third transistor comprising a first current electrode coupled to the second voltage reference, a second current electrode coupled to the second voltage reference, and a control electrode coupled to the first current electrode of the first transistor.

5. The device of claim 4, wherein the device further comprises a fourth transistor comprising a first current electrode coupled to the second input of the comparator, a second current electrode coupled to the first voltage reference, and a control electrode coupled to the first current electrode of the second transistor.

6. The device of claim 5, wherein the third transistor and the fourth transistor are bipolar junction transistors.

7. The device of claim 5, further comprising:
a fifth transistor comprising a first current electrode coupled to the control electrode of the second transistor, a second current electrode coupled to the first current electrode of the second transistor, and a control electrode coupled to the first current electrode of the fifth transistor.

8. The device of claim 7, wherein the fifth transistor is a field effect transistor.

9. The device sensor of claim 7, further comprising:
a first current source comprising an input and an output coupled to the first current electrode of the third transistor, the output to provide a first current based on a signal at the input.

10. The device of claim 9, wherein the first current source comprises a sixth transistor comprising a first current electrode coupled to the second voltage reference, a second current electrode coupled to the first current electrode of the third transistor, and a control electrode coupled to a current reference.

11. The device of claim 10, further comprising:
a second current source comprising an input and an output coupled to the first current electrode of the fourth transistor, the output to provide a first current based on a signal at the input;
a third current source comprising an input and an output coupled to the first current electrode of the fifth transistor, the output to provide a first current based on a signal at the input.

12. The device of claim 11, wherein the second current source comprises a seventh transistor comprising a first current electrode coupled to the second voltage reference, a second current electrode coupled to the first current electrode of the fourth transistor, and a control electrode coupled to the current reference, and the third current source comprises an eighth transistor comprising a first current electrode coupled to the first voltage reference, a second current electrode coupled to the first current electrode of the fifth transistor, and a control electrode coupled to the current source.

13. The device of claim 1, further comprising:
a power control module comprising an input coupled to the output of the comparator, wherein the power control module controls a power level of an integrated circuit device based on a state of a signal provided at the output of the comparator.

14. The device of claim 13, wherein the power control module controls a voltage domain of the integrated circuit device.

15. The device of claim 13, wherein the power control module controls gating of a clock of the integrated circuit device.

16. A method, comprising:
generating a first signal that varies inversely with respect to temperature at a first rate, the first signal being an electrical signal;
generating a second signal that varies inversely with respect to temperature at a second rate, the second rate different from the first rate;
providing a temperature level indication signal based on a comparison of the first signal to the second signal; and
gating a clock signal based on the temperature level indication signal.

17. The method of claim 16, wherein a voltage level of the first signal and a voltage level of the second signal are complementary to absolute temperature (CTAT) voltage levels.

18. The method of claim 16, wherein gating the clock signal comprises:
gating the clock signal to place a first module of an integrated circuit device in a low-power mode in response to the temperature level indication being at first logic level.

19. The method of claim 16, wherein gating the clock signal comprises:
gating the clock signal to place a first module of an integrated circuit device in a normal-power mode in response to the temperature level indication being at a second logic level.

20. A device, comprising:
means for generating a first signal that varies inversely with respect to temperature at a first rate;
means for generating a second signal that varies inversely with respect to temperature at a second rate, the second rate different from the first rate; and
means for providing a temperature level indication signal based on a comparison of the first signal to the second signal; and
means for controlling a first power mode of a first module of an integrated circuit device based on the temperature level indication signal while maintaining a second power mode of a second module of the integrated circuit device.

* * * * *